United States Patent
Chang et al.

(10) Patent No.: US 10,495,982 B2
(45) Date of Patent: Dec. 3, 2019

(54) SYSTEM AND METHOD FOR REAL-TIME OVERLAY ERROR REDUCTION

(71) Applicant: Taiwan Semiconductor Manufacturing Company, Ltd., Hsin-Chu (TW)

(72) Inventors: Shih-Ming Chang, Zhubei (TW); Wen-Chuan Wang, Hsinchu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 568 days.

(21) Appl. No.: 14/064,621

(22) Filed: Oct. 28, 2013

(65) Prior Publication Data

US 2015/0116678 A1    Apr. 30, 2015

(51) Int. Cl.
  *G03B 27/32* (2006.01)
  *G03F 7/20* (2006.01)
  *G03F 9/00* (2006.01)
  *H01J 37/304* (2006.01)
  *H01J 37/317* (2006.01)

(52) U.S. Cl.
  CPC ........ *G03F 7/70633* (2013.01); *G03F 7/7085* (2013.01); *G03F 7/70616* (2013.01); *G03F 9/7092* (2013.01); *H01J 37/3045* (2013.01); *H01J 37/3174* (2013.01); *G03F 7/2059* (2013.01); *G03F 9/7084* (2013.01); *H01J 2237/30455* (2013.01)

(58) Field of Classification Search
  CPC ............. G03F 7/70633; G03F 7/70616; G03F 7/70625; G03F 7/70666–70683; G03F 7/70608; G03F 7/7085; G03F 7/2037; G03F 7/2039; G03F 7/2051; G03F 7/2059; G03F 9/7069; G03F 9/7073; G03F 9/7084; G03F 9/7088; G03F 9/7092; H01J 37/3045; H01J 37/3174; H01J 2237/30455
  USPC ......... 355/52, 53, 55, 67–74, 77; 250/492.1, 250/492.2, 492.22, 493.1, 548; 356/399–401
  See application file for complete search history.

(56) References Cited

U.S. PATENT DOCUMENTS

| | | | | |
|---|---|---|---|---|
| 5,004,925 A | * | 4/1991 | Takahashi | H01J 37/3045 250/491.1 |
| 5,168,166 A | * | 12/1992 | Hayakawa | G02B 21/002 250/491.1 |
| 5,393,988 A | * | 2/1995 | Sakamoto | G03F 1/20 250/398 |
| 5,602,400 A | * | 2/1997 | Kawashima | G03F 9/7026 250/548 |
| 5,783,342 A | * | 7/1998 | Yamashita | G03F 9/70 356/511 |

(Continued)

FOREIGN PATENT DOCUMENTS

JP   WO 2013118613 A1 *   8/2013   ......... G03F 7/70633

*Primary Examiner* — Christina A Riddle
(74) *Attorney, Agent, or Firm* — Haynes and Boone, LLP

(57) ABSTRACT

Disclosed is a lithography system. The lithography system includes a radiation source to provide radiation energy for lithography exposure; a substrate stage configured to secure a substrate; an imaging lens module configured to direct the radiation energy onto the substrate; at least one sensor configured to detect a radiation signal directed from the substrate; and a pattern extraction module coupled with the at least one sensor and designed to extract a pattern of the substrate based on the radiation signal.

21 Claims, 11 Drawing Sheets

(56) References Cited

U.S. PATENT DOCUMENTS

| | | | | |
|---|---|---|---|---|
| 6,801,313 | B1* | 10/2004 | Yokota | G03F 7/70633 257/E23.179 |
| 7,080,330 | B1* | 7/2006 | Choo | G03F 7/70633 716/136 |
| 2002/0036761 | A1* | 3/2002 | Nakasugi | G03B 27/42 355/53 |
| 2002/0080364 | A1* | 6/2002 | Monshouwer | G03F 7/70633 356/508 |
| 2003/0197135 | A1* | 10/2003 | Yamada | B82Y 10/00 250/492.23 |
| 2003/0223066 | A1* | 12/2003 | Lee | G03F 7/70633 356/401 |
| 2006/0103035 | A1* | 5/2006 | Maruyama | H01J 37/3045 257/797 |
| 2007/0064211 | A1* | 3/2007 | Hatai | G03F 7/70633 355/55 |
| 2007/0164234 | A1* | 7/2007 | Tsuji | G03F 7/70775 250/491.1 |
| 2010/0294955 | A1* | 11/2010 | Wang | B82Y 10/00 250/492.3 |
| 2011/0085179 | A1* | 4/2011 | Mann | G03F 7/70233 356/614 |
| 2011/0268363 | A1* | 11/2011 | Osaki | G03F 7/70633 382/209 |
| 2014/0038107 | A1* | 2/2014 | Chen | H01J 37/3174 430/296 |
| 2014/0152969 | A1* | 6/2014 | Bleeker | G03F 7/70291 355/67 |
| 2014/0320627 | A1* | 10/2014 | Miyamoto | G03F 7/70633 348/80 |

* cited by examiner

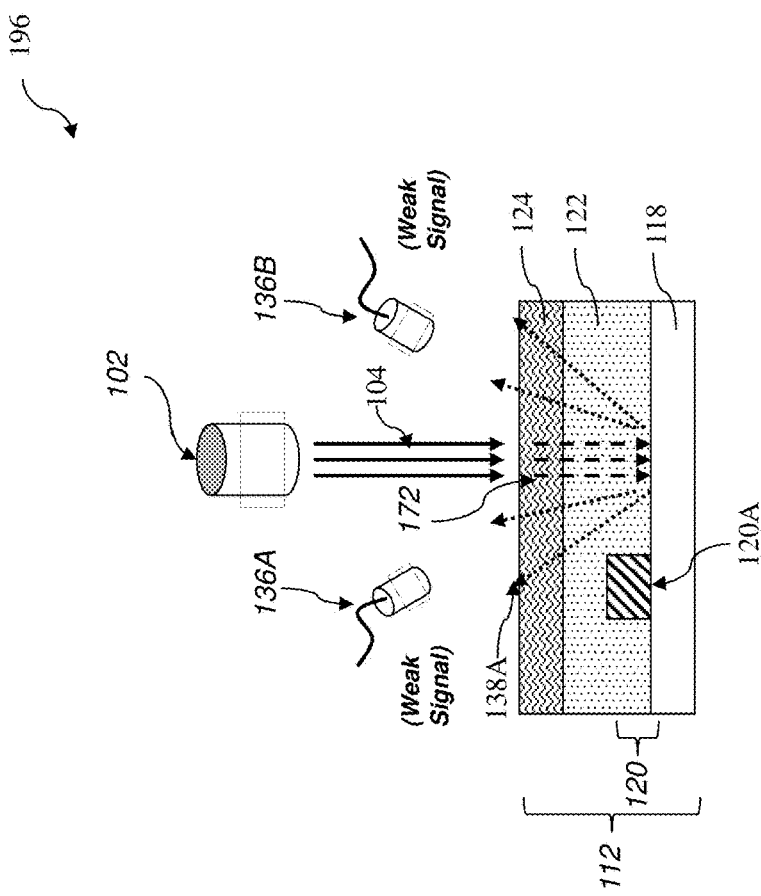
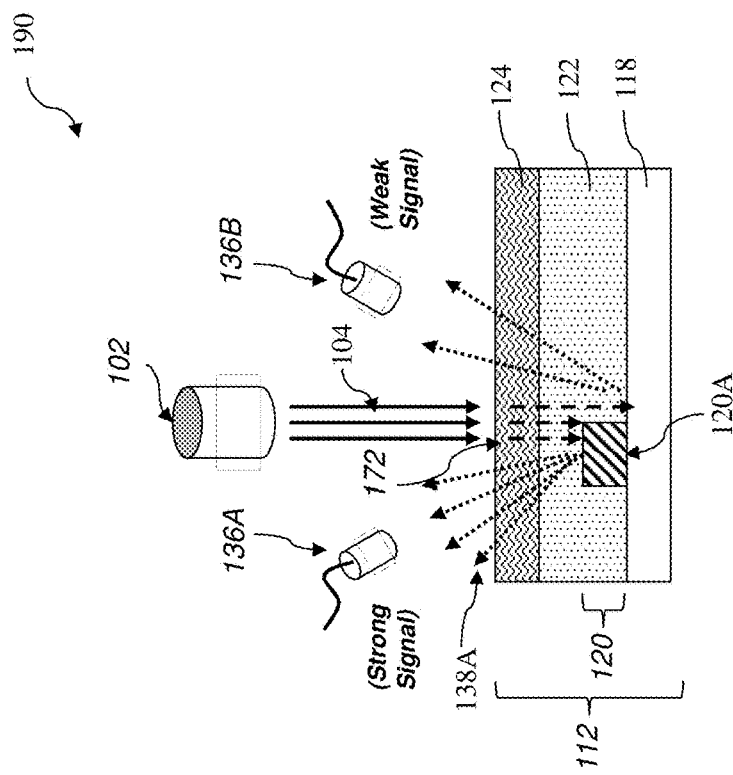

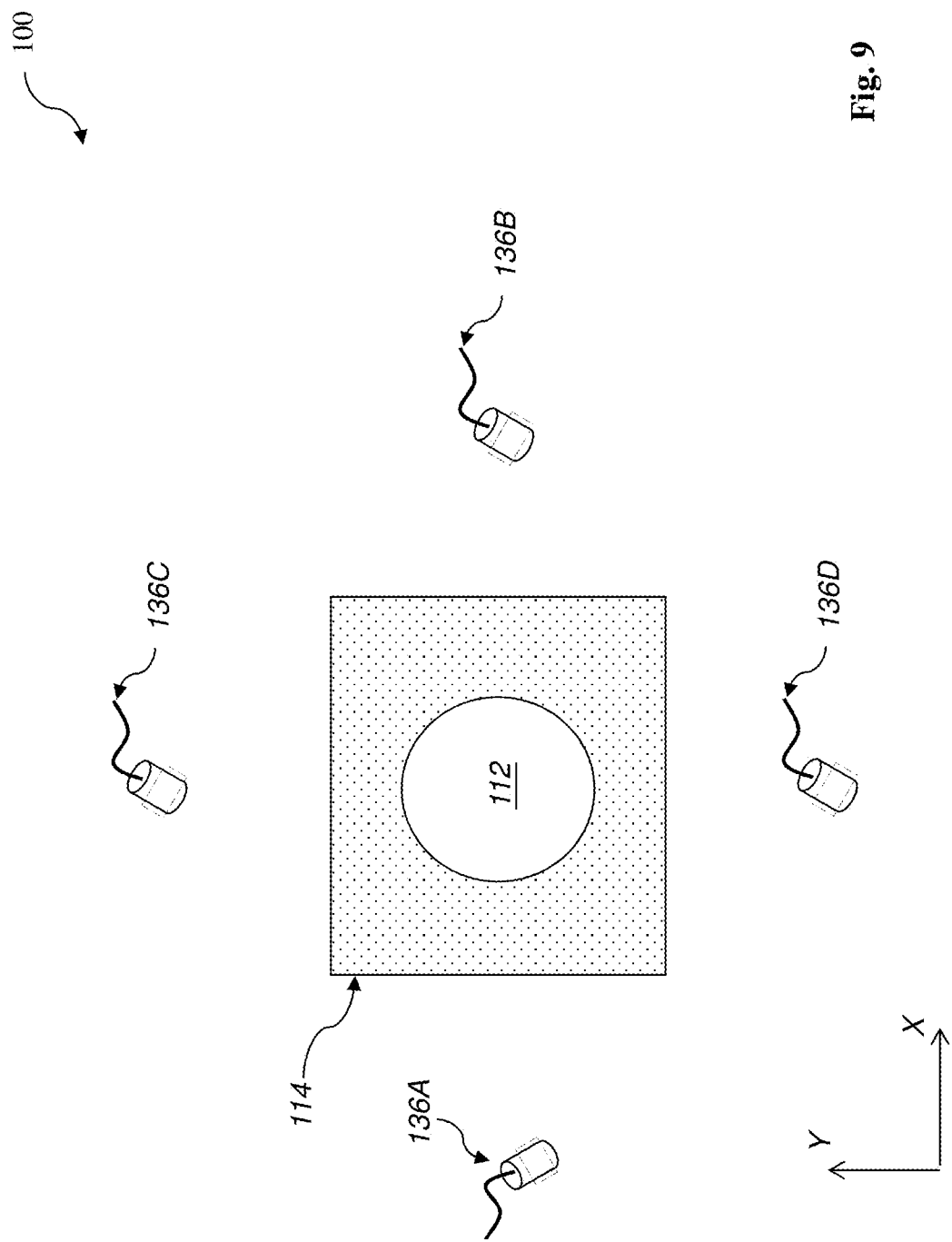

SYSTEM AND METHOD FOR REAL-TIME OVERLAY ERROR REDUCTION

BACKGROUND

Semiconductor integrated circuit (IC) technology has experienced rapid progress including the continued minimization of feature sizes and the maximization of packing density. The minimization of feature size relies on improvement in photolithography and its ability to print smaller features or critical dimensions (CD). Especially, a lithography process to form an IC pattern to a semiconductor wafer needs to ensure that the formed IC pattern on the semiconductor wafer is aligned with the underlying patterned layer from location to location and from feature to feature. Otherwise, one or more overlay error may present, introducing various issues, such as defects, circuit failure and/or wafer scraping. For example, when a metal line is not aligned with an underlying via feature, the integrated circuit may be failed due to circuit open issue.

It is necessary to monitor overlay errors or shifting. However, in the existing technologies to check overlay error, there are various concerns and issues. For examples, overlay check is time consuming and the overlay check is not efficient (using more wafer areas by overlay marks and additional overlay metrology system). Particularly, the overlay check evaluates the overlay shifts on the overlay marks but not the overlay shifts on the real circuit. Also, the current method is to monitor overlay errors after lithography process and to check if these errors pass the criteria for going to next process stage. There is no method to real-time feedback to a lithography tool during the lithography exposure process.

Therefore, what is needed is an apparatus and a method to implement overlay monitor to address the above issues.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 5 through 8 illustrate the lithography system of FIG. 1 in fragmental views and a substrate in sectional views constructed according to aspects of the present disclosure in various embodiments.

FIG. 9 is a fragmental view of a lithography system of FIG. 1 constructed according to aspects of the present disclosure in one or more embodiments.

DETAILED DESCRIPTION

Figure 1:
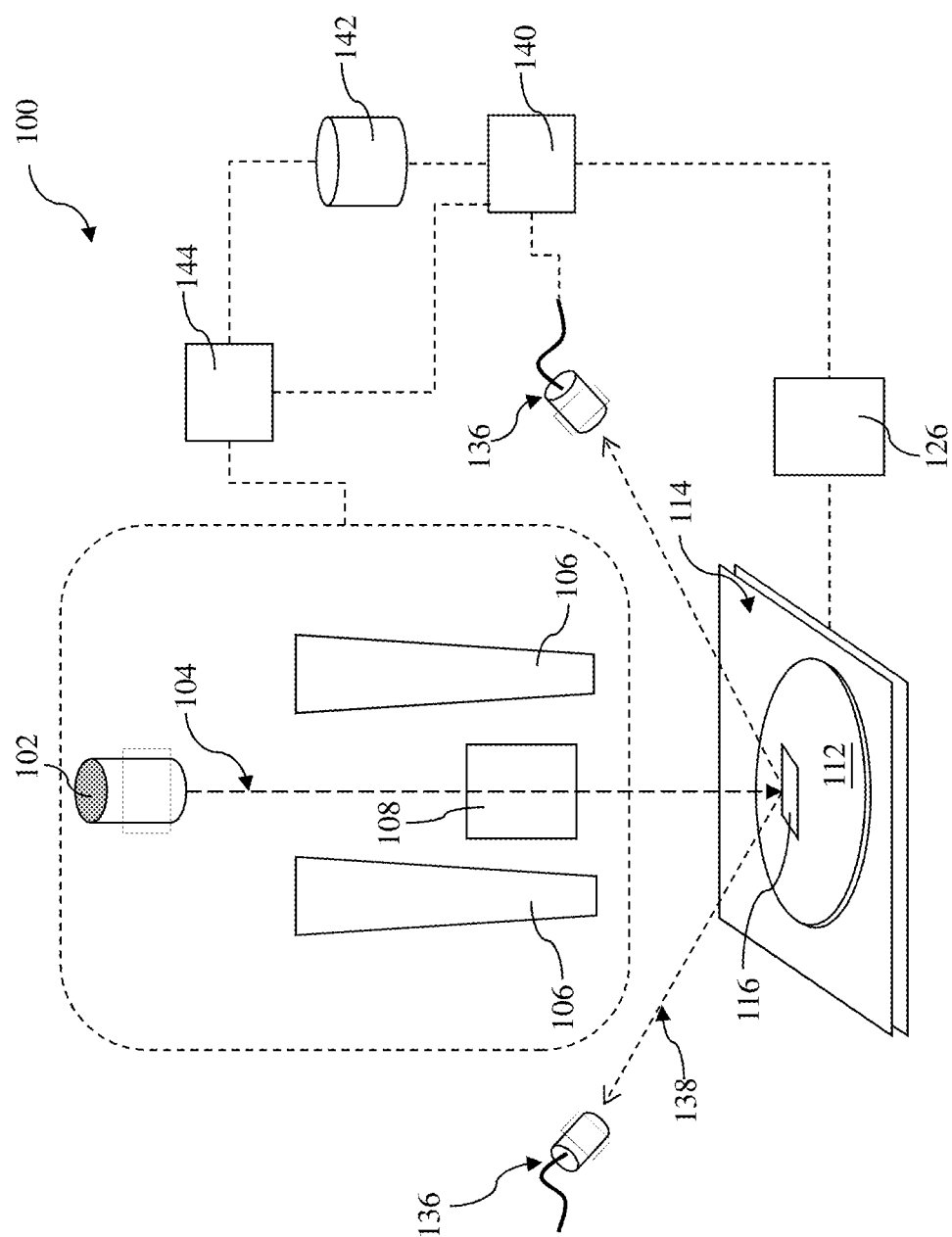
FIG. 1 is a schematic view of a lithography system with overlay monitor constructed according to aspects of the present disclosure in one or more embodiments.

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a schematic view of a lithography system 100 that is designed to perform a lithography exposure process. Furthermore, the system is capable of checking overlay error in time during an exposure process and is operable to correct overlay error in real time, constructed according to aspects of the present disclosure in various embodiments. With reference to FIG. 1 and other figures, the lithography system 100 and the method utilizing the same are collectively described. Referring to FIG. 1, in one embodiment, a lithography system 100 includes a radiation source (or source) 102 to provide energy. The energy can be an electromagnetic wave, a charged-particle beam, or other suitable energy flow. In the present embodiment, the radiation source 102 is an electron source to provide one or more electron-beam (e-beam). Alternatively, the radiation source may be any suitable light source. In one example, the e-beam source 102 is an electron gun with a mechanism to generate electrons, such as by thermal electron emission. In a particular example, the electron gun includes a tungsten (or other suitable material) filament designed and biased to thermally emit electrons. In FIG. 1, an electron beam 104 is illustrated as an incident electron beam from the radiation source and directed toward a semiconductor wafer 112 to be patterned. In other embodiments, the radiation source 102 may include ion beam or other suitable radiation source, such as ultraviolet (UV) source or deep UV (DUV) source.

The system 100 includes one or more lenses 106 to impact the incident electron beam 104 from the radiation source 102 for imaging effect. In one embodiment, the lenses 106 includes a condenser and further includes an objective lens properly configured. Various lenses, such as magnets, are designed to provide force to the electrons for proper imaging effect, such as focusing.

The system 100 also includes a deflector 108 to deflect the electron beam 104 for scanning a certain region of the wafer 112 in a certain mode, such as vector mode or raster mode. The deflector 108 is operable to direct the electron beam 104 to the wafer 112 positioned on a stage 114. In one example, the deflector 108 may include one or more coils to deflect the electron beam 104 in two orthogonal directions such that the electron beam is scanned over a surface area (a field) 116 of the wafer 112. In another example, the deflector 108 may include one or more coils to deflect the electron beam 104 in one direction while the wafer 112 on the stage 114 moves in an orthogonal direction such that the electron beam is scanned over the field 116 of the wafer 112.

The wafer 112 is further described with reference to FIG. 2 in a sectional view according to one or more embodiment. In the present embodiment, the wafer 112 includes a semiconductor substrate 118, such as a silicon substrate. The substrate 118 may include other semiconductor material or may include a silicon wafer with other semiconductor material formed thereon. Other semiconductor material may include a suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. The semiconductor wafer may further include various doped regions, dielectric features, and multilevel interconnects (or are formed at subsequent manufacturing steps).

Particularly, the wafer 112 includes a patterned layer 120 formed on the substrate 118 and a material layer 122 disposed on the patterned layer 120, The material layer 122 is to be patterned by the lithography process such that the overlay error between the patterned layer 120 and the material layer 122 is within a tolerable range. For better understanding, the following terms are introduced. The patterned layer 120 is formed according to a first IC layout is referred to as a first pattern. The pattern to be formed on the material layer 122 according to a second IC layout is referred to as a second pattern. The overlay error is evaluated according to the alignment between the first and second patterns from location to location. In one example for illustration, the first pattern in the patterned layer 120 includes metal lines and the second pattern to be formed in the material layer 122 includes via features (or metal trenches to form via features by filling with metal) that are aligned with the metal lines for electrical routing. In another example, the first pattern in the patterned layer 120 includes various gate electrodes for field effect transistors and the second pattern to be formed in material layer 122 includes various contact features landing on respective gate electrodes. The wafer 112 further includes a resist layer 124 coated on the material layer 122. The resist layer 124 is sensitive to e-beam in the present embodiment and can be patterned by the e-beam lithography process to form a resist pattern, which is used to further pattern the material layer 122 by a suitable process (such etch to form a trench pattern or ion implantation to form doped features therein).

Back to FIG. 1, the lithography system 100 includes a stage control module 126 coupled with the wafer stage 114 and designed to control the wafer stage 114 for various motions, such as translational motions and rotational motions in a plane perpendicular to the optical axis of the imaging lens module 106. In one example, the stage control module 126 includes a step motor to move the wafer stage 114 in precise control.

Figure 3:
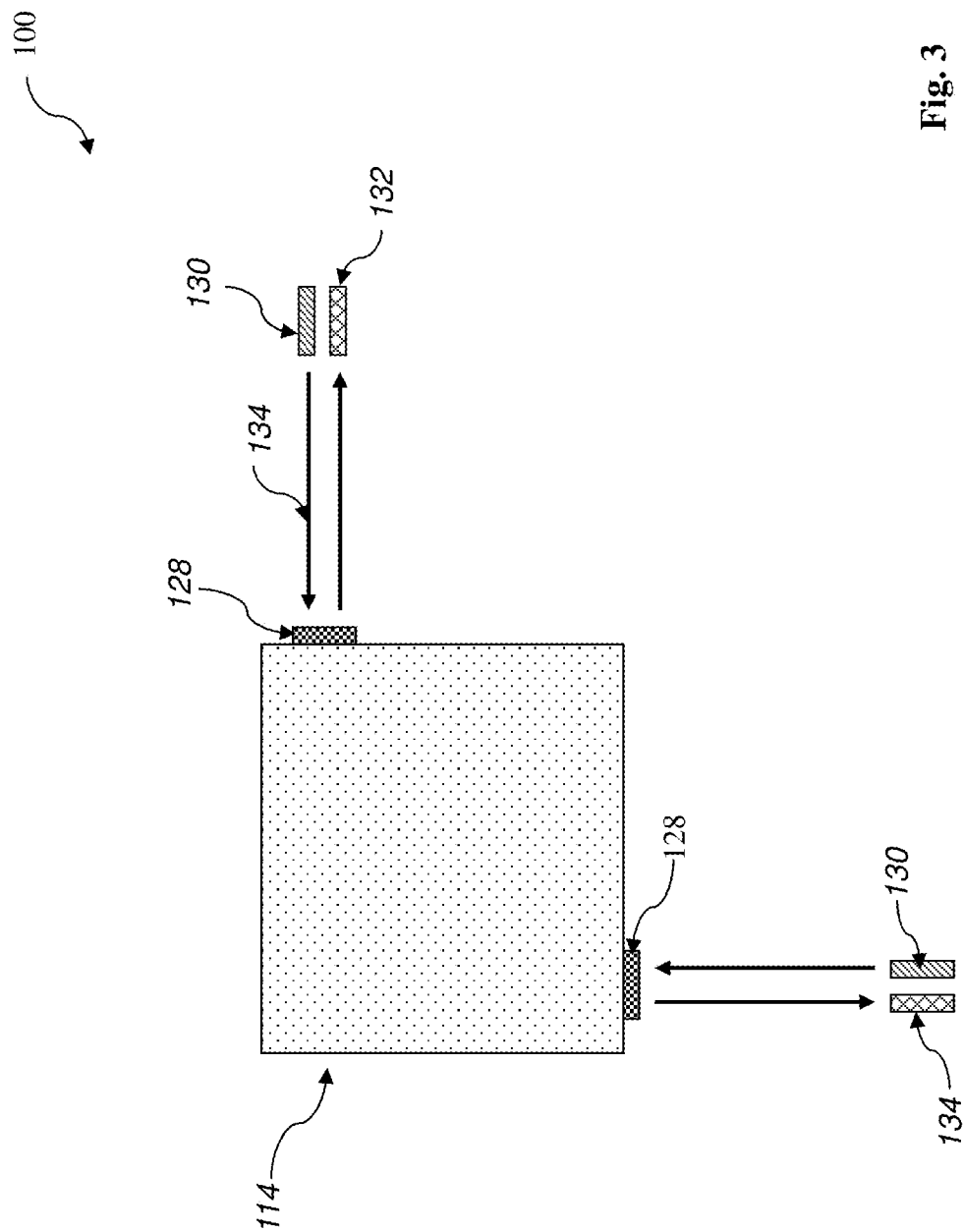
FIG. 3 is a fragmental view of a lithography system of FIG. 1 constructed according to aspects of the present disclosure in one or more embodiments.

The stage control module 126 includes a mechanism, such as an optical structure, to monitor the position of the wafer stage 114, which is further described with reference to FIG. 3 as a top view of one embodiment of the lithography system 100 in portion. The stage control module 126 includes various mirrors 128 attached to sides of the wafer stage 114. The stage control module 126 further includes emitters 130 and receivers 132 configured with the mirrors 128 to monitor the position of the wafer stage 114 in two orthogonal directions. In one embodiment, the mirrors 128, the emitters 130 and receivers 132 are configured in two groups and each group includes one mirror, one emitter and one receiver. Each group is configured such that a light signal 134 from the emitter 130 is directed to the mirror 128 and is reflected toward the receiver 132, as illustrated in FIG. 3.

Referring back to FIG. 1, the system 100 includes one (or more than one) sensor 136 configured to receive and detect a radiation signal 138 from the wafer 112. The radiation signal 138 is reflected from the wafer 112. Especially, the radiation signal 138 includes a portion that is reflected from the patterned layer 120 of the wafer 112 within the (scanning) spot where the e-beam 104 is projected on during the e-beam lithography exposure process. Therefore the radiation signal 138 carries the pattern information of the patterned layer 122. In the present embodiment, the radiation signal includes e-beam, as a fraction of the incident e-beam 104 directed to the wafer 112. The sensor 136 is configured properly to receive the reflected fraction accordingly. For example, the sensor 136 may be angled to maximize the received radiation signal. It is advantageous to utilize the disclosed method in the lithography system 100 of the e-beam technology since the e-beam can penetrate the resist layer 124 and be scatted back from the patterned layer 120. In other embodiments, the radiation signal 138 may additionally or alternatively include other radiation signal, such as light signal.

In one embodiment, the system 100 includes a plurality of sensors 136 configured at different locations enabling to extract the pattern information of the patterned layer 120 from the collective radiation signal 138 collected from various sensors 136. In one example, two sensors 136 are configured on opposite sides of the wafer stage 114, as illustrated in FIG. 1. In furtherance of the example, the two sensors 136 are symmetrically configured on the opposite sides of the wafer stage 114. In another example, four sensors 136 are symmetrically configured around the wafer stages. In furtherance of the example, the four sensors 136 are configured on four corners of a virtual square that is concentric with the wafer stage 114 or with the wafer 112 secured on the wafer stage. The virtual square is perpendicular to the optical axis of the incident e-beam 104 or parallel with the wafer 112 secured on the wafer stage 114. More sensors 136 may provide more data for extracting the patterned layer but need more capacity for data analysis. It is noted that the radiation signal 138 is collected in real time during the lithography exposure process, instead of off-line overlay measurement by an overlay metrology tool. Further, the radiation signal from the sensors 136 carry the information of the IC pattern in the patterned layer 120. The IC pattern of the patterned layer 120 thus extracted is used to determine the overlay error. This will be further described later in various embodiments of the present disclosure.

The lithography system 100 also includes a pattern extraction module 140 to extract the information of the patterned layer 120 during the lithography exposure process. The pattern extraction module 140 is coupled with the sensor(s) 136 for receiving the data of the radiation signal from the sensor(s) 136. The pattern extraction module 140 includes hardware and software integrated to perform data analysis to the data of the radiation signal for pattern extraction. The pattern extraction module 140 is coupled with a database 142 to save the various data including the data of the radiation signal 138 and/or the data of the extracted pattern.

In the present embodiment, the pattern extraction 140 is designed to further identify the overlay error based on the extracted pattern information. The overlay error is defined as misalignment between the patterned layer and the resist layer. The resist layer 124 is exposed by the lithography exposure process according to an IC pattern to be defined on the material layer 122. In the spot of the wafer 112 where the incident beam 104 is directed on, the portion of the IC pattern should be aligned with the corresponding portion of the pattern of the patterned layer 120. Otherwise, an overlay error (overlay shift) is identified at this spot. The IC pattern used for the lithography exposure process may be used with the pattern of the patterned layer 120 for determining the overlay error. In one example, the IC pattern is saved in the database 142. In an alternative embodiment, the overlay error may be extracted by a separate overlay module coupled with the pattern extraction module 140.

The lithography system 100 includes one or more mechanism to compensate the overlay shift based on the identified overlay shift, either in real time or in a feedback loop to compensate the overlay shift for the subsequent wafers to be patterned by the lithography system 100.

In one embodiment, the lithography system 100 includes an e-beam exposure control module 144 coupled with various components to control the e-beam exposure process according to the IC pattern. For example, the e-beam exposure process is in direct write mode and the e-beam exposure control module 144 controls the e-beam direct writing according to the IC pattern. The pattern extraction module 140 is coupled with the e-beam exposure control module 144 to modify the IC pattern according to the overlay shift such that the overlay shift is compensated (corrected). Alternatively, the IC pattern in the database 142 is directly modified according to the overlay shift. The e-beam exposure control module 144 continues its exposure process based on the modified IC pattern.

In another embodiment, the pattern extraction module 140 is coupled with the stage control module 126 to tune the motion of the wafer stage 114 during the lithography exposure process according to the overlay shift such that the overlay shift is compensated.

Figure 4:
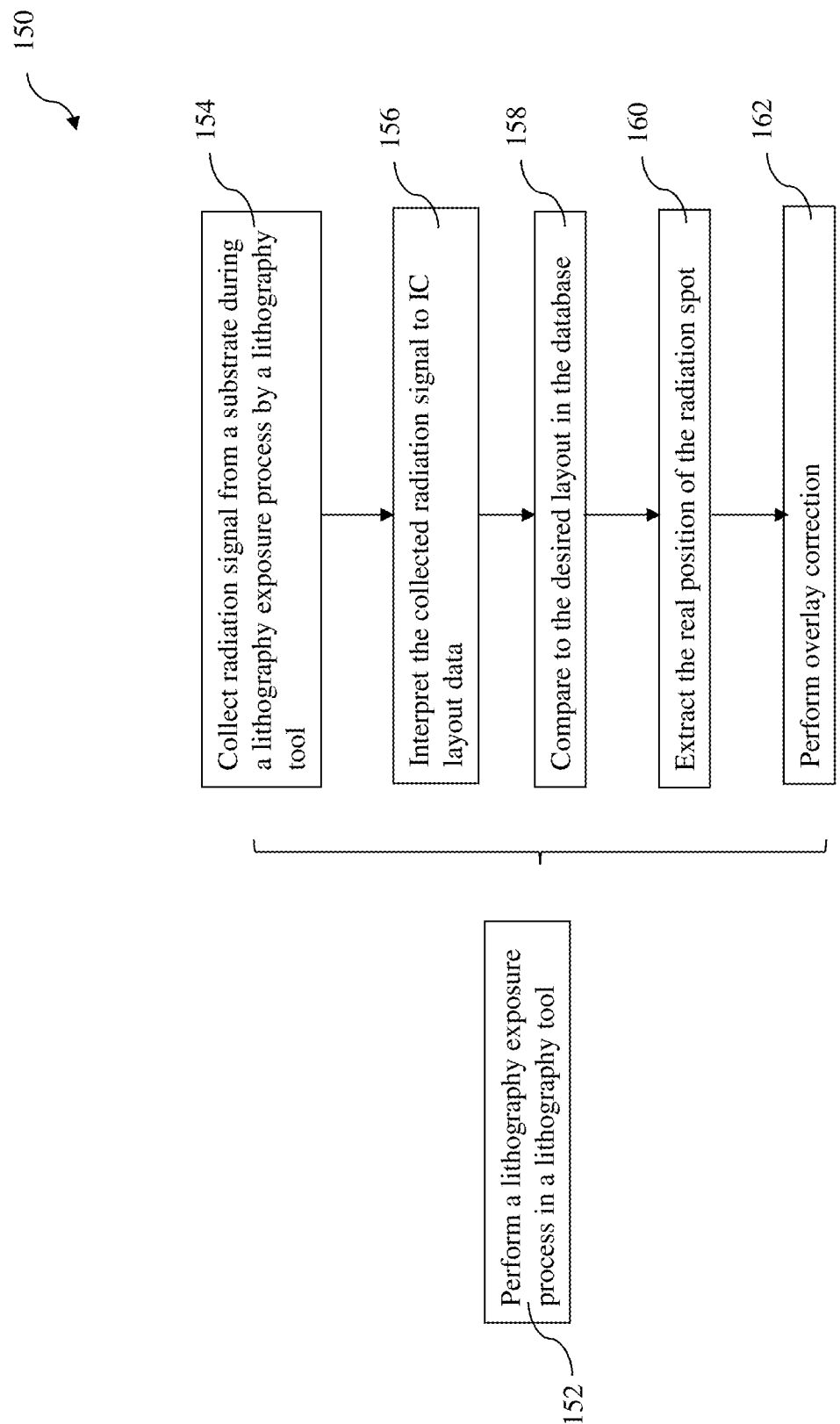
FIG. 4 is a flowchart of a method to implement the lithography system of FIG. 1 constructed according to aspects of the present disclosure in one embodiment.

FIG. 4 is a flowchart of a method 150 to perform a lithography process with overlay monitor constructed according to aspects of the present disclosure in various embodiments. The method 150 is implemented in the lithography system 100 in the present embodiment. The method 150 and the lithography system 100 are further described with reference to FIGS. 1-4 and other figures. The method 100 includes an operation 152 to perform a lithography exposure process in a lithography exposure system, (the lithography system 100 in the present embodiment). The lithography exposure process is applied to the resist layer 124 coated on the wafer 112 that is secured on the wafer stage 114. In the present embodiment, the lithography exposure process uses e-beam to expose the resist layer 124 according to an IC pattern. The e-beam lithography exposure process is implemented in a suitable mode, such as raster scan or vector scan.

The method 150 includes an operation 154 to collect radiation signal 138 from the wafer 112 during the lithography exposure process. The radiation signal 138 is collected by the sensor(s) 136. The radiation signal 138 is reflected from the wafer 112. Especially, the radiation signal 138 includes a portion that is reflected from the patterned layer 120 of the wafer 112 within the spot where the incident radiation beam 104 is projected on during the lithography exposure process. In the present embodiment, the radiation signal 138 includes e-beam, as a fraction of the incident e-beam 104 directed to the wafer 112. The operation 154 is implemented during the lithography exposure process and is in parallel therewith.

As noted above, the sensor 136 may include multiple sensors (2, 4 or more in various examples) properly configured to detect the radiation signal 138 from the wafer 112 for pattern extraction, such as extracting the pattern information of the patterned layer 120. In one embodiment for illustration, two sensors 136 are symmetrically configured on opposite sides of the wafer stage 114, as illustrated in FIG. 1.

The method 150 includes an operation 156 by interpreting the collected radiation signal, particularly extracting characteristic data of the radiation signals 136 that is relevant to the pattern information of the patterned layer 120. With reference to FIG. 2, the wafer 112 and corresponding terms are used for the following descriptions. Especially, the first pattern defined in the patterned layer 120 includes an exemplary feature 120A and the second pattern to be formed in the material layer 122 is to be formed on the resist layer 124 by the lithography exposure process. As one embodiment illustrated in FIGS. 5-8, the interpreting of the radiation signal 138 is described. When the incident e-beam 104 is directed on the wafer 112, and partially penetrates the resist layer 124 and the material layer 122, it is further reflected from the patterned layer 120 and the semiconductor wafer 118. Accordingly, the penetrating e-beam is referred to as penetrating beam 172 and the reflected beam is referred to as reflected beam 138. Particularly, two sensors 136 are configured on opposite sides of the wafer 112 and are spanned in the X direction, referred to as sensors 136A and 136B, respectively. The corresponding radiation signals from the sensors 136A and 136B are referred to as radiation signals 138A and 138B, respectively.

Figure 5:
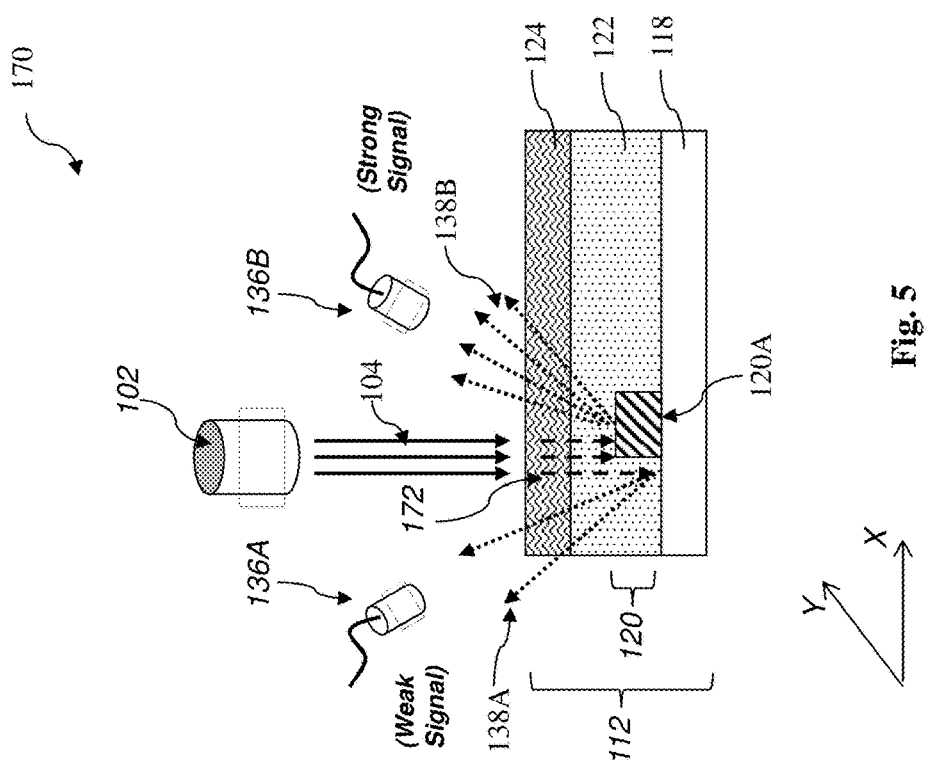

As illustrated in FIG. 5, during the lithography exposure process when the incident e-beam 104 scan over the left edge of the feature 120A, the radiation signal 136A has a less intensity since with more absorption from the material layer 122 and the radiation signal 136B has a greater intensity relative to the radiation signal 136A.

Figure 6:
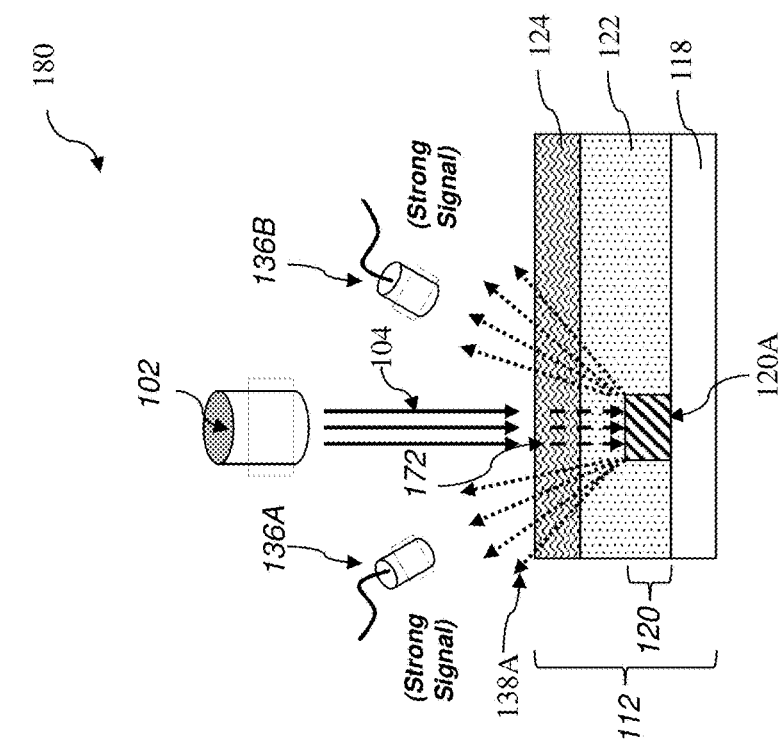

As illustrated in FIG. 6, during the lithography exposure process when the incident e-beam 104 scan over the feature 120A, both the radiation signal 136A and the radiation signal 136B have strong intensities.

As illustrated in FIG. 7, during the lithography exposure process when the incident e-beam 104 scan over the right edge of the feature 120A, the radiation signal 136B has a less intensity since with more absorption from the material layer 122 and the radiation signal 136A has a greater intensity relative to the radiation signal 136B.

As illustrated in FIG. 8, during the lithography exposure process when the incident e-beam 104 scan away the feature 120A and over the semiconductor wafer 118 without intervening patterned layer 120, both the radiation signal 136A and the radiation signal 136B have weak intensities.

By the asymmetrical characteristics of the radiation signals 136A and 136B, it is able to determine the current exposure spot of the incident beam 104 is at what location relative to the feature 120A.

In another embodiment, with four sensors 136 configured around the wafer stage 114. As illustrated in FIG. 9, two sensors 136A and 136B are configured on opposite sides of the wafer 112 and are spanned in the X direction. Two additional sensors 136C and 136D are configured on other opposite sides of the wafer 112 and are spanned in the Y direction that is orthogonal to the X direction.

The method 150 may include an operation 158 by comparing the extracted data to the desired first IC layout in the database to determine the location of the scanning spot of the incident beam 104. The extracted data include those characteristic data obtained at the operation 156, such as asymmetric characteristics of the radiation signals 136. The extracted data are compared with the desired portion of the first IC layout to determine it is left edge of which feature when the asymmetric signals are similar to those in FIG. 5. During the lithography process, the incident radiation beam 104 exposes the resist layer according to the second pattern with consideration of the spatial relationship between the first and second patterns from location to location. Therefore, the second pattern is spatial related to the first pattern. During the lithography exposure process implemented according to the second IC layout, the desired structure of the patterned layer 120 under the incident beam is known. By comparing, the corresponding feature in the patterned layer 120 is identified, such as identified to be the feature 120A.

The method 150 includes an operation 160 to extract the real position of the scanning spot of the incident radiation beam 104 based on the results from the operations 156 and 158. In one embodiment, the real position of the scanning spot is determined by identifying which feature of the patterned layer 120 is the relevant feature in the operation 158 and identifying which location (such as left edge or right edge) of the relevant feature in the operation 156. Especially, the intensity profiles of the reflected radiation signals 136 provide information to precisely determine where is the location of the left edge of the feature 120A. For example, the different between a first intensity profile from of the left radiation signal and a second intensity profile from of the right radiation signal when scanning through the feature 120A would have a profile with two peaks associated with the left and right edges, respectively. Thus, the location of the scanning spot during the lithography exposure process is determined thereby. Especially, the location of the scanning spot in the X direction is determined by the corresponding radiation signals from the respective sensors 136A and 136B. Similarly, the location of the scanning spot of the incident beam 104 in the Y direction during the lithography exposure process is determined by the corresponding radiation signals from the respective sensors 136C and 136D.

Furthermore, with determined real position of the scanning spot relative to the patterned layer 120, the overlay error (shift) between the first pattern and the second pattern is determined accordingly in the operation 160. It is noted that even though the second pattern is not formed in the material layer 122 yet, the location of the second pattern on the scanning spot is determined since the second pattern is defined by the lithography exposure process. Particularly, the latent pattern is formed on the resist layer 124 by the lithography exposure process. The latent pattern will be transferred to a resist pattern in the resist layer 120 by a developing process and will be further transferred to the material layer 122 by a subsequent process, such as etching or ion implantation. The overlay error may be determined based on the extracted real position of the scanning spot and the desired position of the scanning spot.

The operations 156-160 are implemented to collectively determine the overlay shift for a local location where the incident beam 104 is directed to. Those operations may be executed by the pattern extraction module 140. Those operations may be implemented in different procedures to achieve the same.

The method 150 may also include an operation 162 to perform an overlay correction based on the identified overlay error. The overlay correction is a real time process during the lithography exposure process 152. The overlay error is feedback to tune the lithography exposure process such that the overlay error is compensated. This is a dynamic and continuous process through the lithography exposure process. The overlay error at a scanning spot is compensated simultaneously during the real time of the lithography exposure process. The operation 160 may utilize one or more mechanism to compensate the overlay shift based on the identified overlay shift.

In one embodiment, the e-beam exposure control module 144 controls the e-beam direct writing according to the IC pattern. The pattern extraction module 140 is coupled with the e-beam exposure control module 144 to modify the second IC layout according to the overlay shift such that the overlay shift is compensated (corrected). For example, the second IC layout in the database 142 is directly modified according to the overlay shift. The e-beam exposure control module 144 continues its exposure process based on the modified IC pattern.

In another embodiment, the stage control module 126 controls the motion of the wafer stage 114 during the lithography exposure process according to the identified overlay shift such that the overlay shift is corrected. For example, the pattern extraction module 140 is coupled with the stage control module 126 and feeds the identified overlay shift to the stage control module 126 such that the motion of the wafer stage 114 is adjusted accordingly.

In alternative embodiment, the operation 160 for the overlay correction may be in a feedback loop to compensate the overlay shift for the subsequent wafers to be patterned by the lithography system 100. For example, a first wafer is exposed by the lithography exposure process in the lithography system 100 with a collected overlay map that includes overlay shift for various locations of the corresponding wafer. A second wafer of the same type product with the same first and second patterns is subsequently exposed by the lithography exposure process in the lithography system 100. The lithography exposure process is adjusted (such as modifying the second IC pattern or adjusting the motion of the wafer stage 114) according to the overlay map to compensate the overlay shift. In another example, a sacrificial wafer is exposed by the lithography exposure process in the lithography system 100 with a collected overlay map. Subsequent wafers (such as one batch of wafers) of the same type with the same first and second patterns are subsequently exposed by the lithography exposure process in the lithography system 100. The lithography exposure process is adjusted (such as modifying the second IC pattern or adjusting the motion of the wafer stage 114) according to the overlay map to compensate the overlay shift for the subsequent of wafers.

In the method 150, the operations 154-162 are implemented during the lithography exposure process 152. The operation 152 and the operations 154-162 are implemented in parallel.

The method 150 presents various advantages according to various embodiments. In one embodiment where the lithography system 100 uses e-beam for the lithography exposure process, the overlay error is determined between the patterned layer 120 and the IC layout to be transferred to the resist layer 124. Since the overlay monitoring is a real time process during the lithography exposure process, the overlay error is actually determined as the overlay shift between the location of the patterned layer 120 and the landing location of the incident radiation beam 104. Particularly, the operation 162 to correct the overlay error directly adjusts the location of the incident radiation beam 104 during the lithography exposure process, either by the adjustment of the wafer stage 114 or the modifying the IC layout.

In another embodiment, the lithography system 100 uses e-beam for the lithography exposure process. Defects in the exposed pattern by the e-beam or overlay errors randomly present and distribute. The e-beam lithography exposure process is able to dynamically amend the IC layout and/or correct dose according to local overlay error and/or defect in real time. In another embodiment, since the overlay monitor is implemented by the lithography system 100 and the method 150, there is no additional overlay tool to monitor the overlay errors, leading to the cost reduction of manufacturing hardware. Furthermore, the manufacturing throughput is enhanced since the overlay monitor is implemented during the lithography exposure process and there is no additional time from the overlay monitoring. In another embodiment, the overlay monitor is implemented based on the extracted pattern information from the real circuit pattern of the patterned layer by the lithography system 100 and the method 150, there is no need for additional overlay marks to be formed on the semiconductor wafers. Thus the precious wafer surface is saved to form more IC features and the IC packing density on the semiconductor wafers are increased and the cost per integrated circuit is reduced. In another embodiment, the overlay error determined by the method 150 is intrinsically an overlay error to a local circuit location. For example, when a metal line is expected to be aligned with an underlying via feature for electrical routing, the overlay error determined by the method 150 is intrinsically the overlay error between the metal line and the via feature and therefore is more accurate. In the existing method, the overlay error for a local circuit location is predicted based on the overlay errors from the overlay marks.

The method 150 may include other operations implemented before, during and/or after various operations described above. Especially, the lithography exposure process is one step of a lithography patterning process. The lithography patterning process may further include resist coating (before the lithography exposure process), post-exposure baking and developing to form a patterned resist layer. An etching process is applied to the material layer 122 afterward to form trenches in the material layer using the patterned resist layer as an etch mask.

Figure 10:
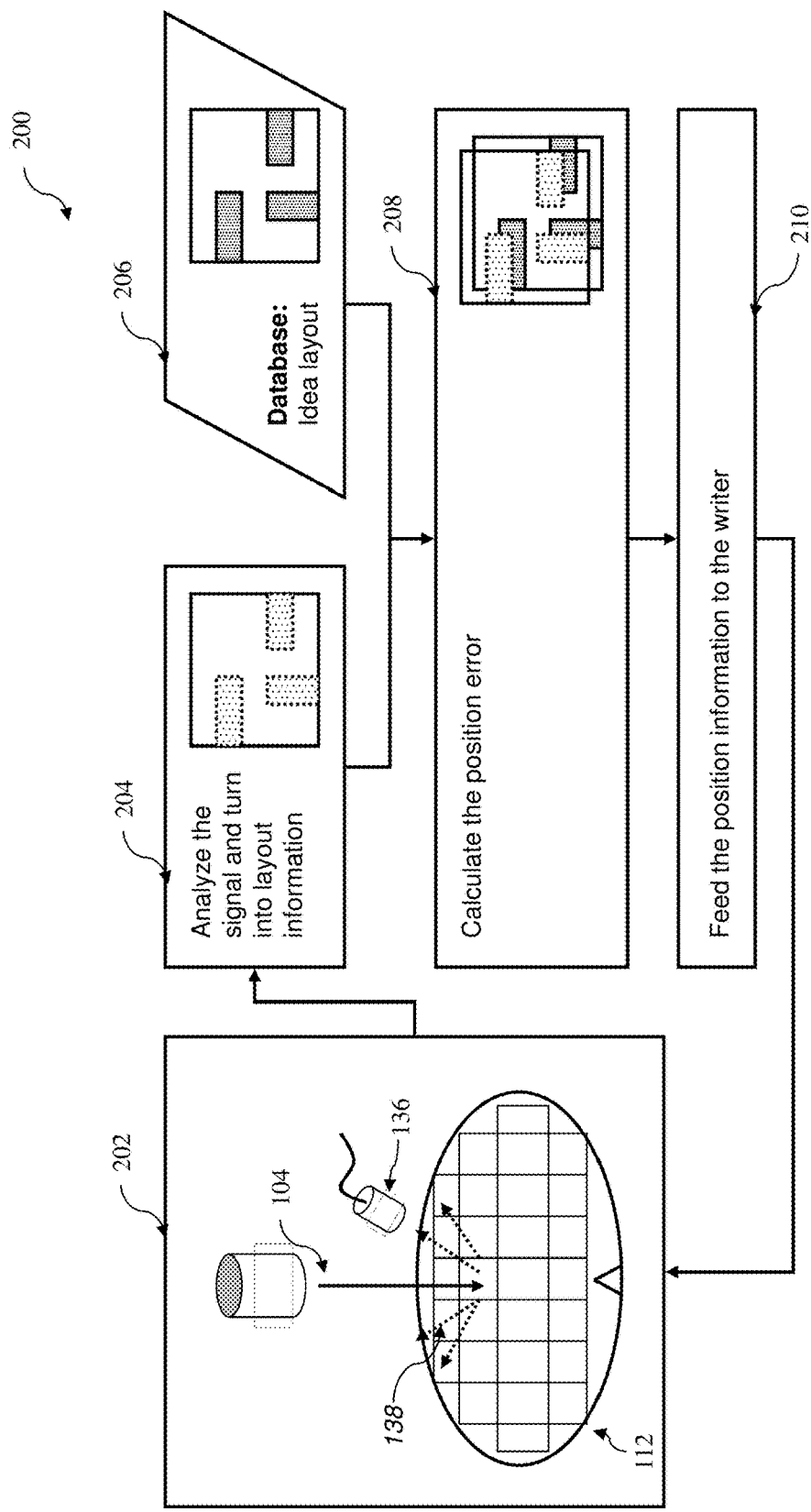
FIG. 10 is a block diagram illustrating various embodiments of the method of FIG. 4 constructed according to aspects of the present disclosure.

FIG. 10 is a block diagram of a method 200 for a lithography exposure process with overlay monitoring and overlay correction according to another embodiment. The method 200 may be one example of the method 150 and be implemented in the system 100. The method 200 is described with reference to FIG. 10 and with further reference to FIGS. 1-4.

The method 200 begins with an operation 202 by collecting radiation signal 138 from the wafer 112 during a lithography exposure process. The operation 202 and the lithography exposure process are implemented in the lithography system 100. The radiation signal 138 includes a portion that is reflected from the patterned layer 120 of the wafer 112 within the spot where a radiation beam 104 is projected on during the lithography exposure process. It is noted that the radiation signal 138 are from circuit features in the wafer 112 (instead of overlay marks in the existing methods). In the present embodiment, the radiation signal 138 includes e-beam, as a fraction of the incident e-beam 104 directed to the wafer 112. The operation 202 is implemented during the lithography exposure process and is in parallel therewith.

Figure 2:
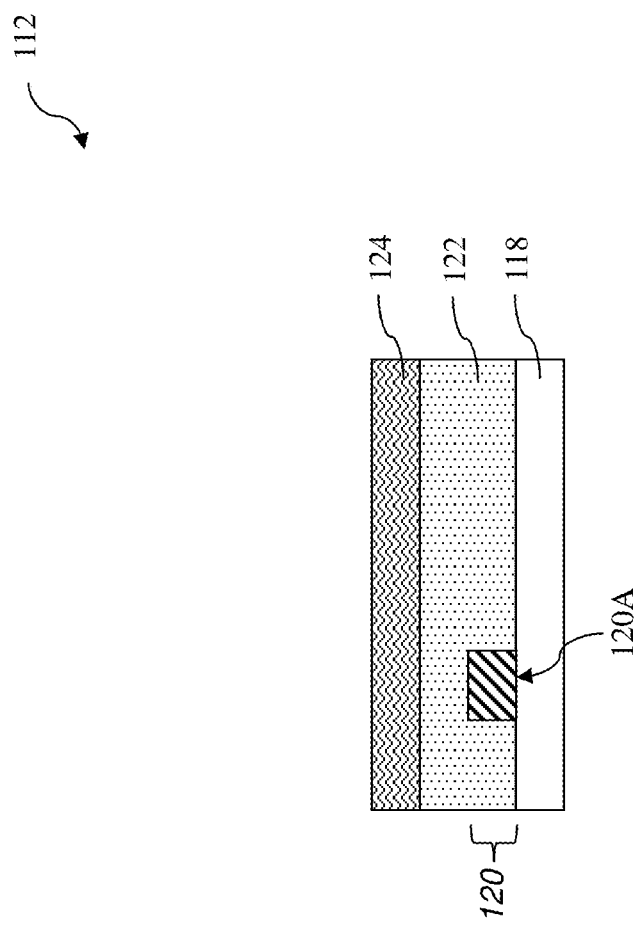
FIG. 2 is a sectional view of a semiconductor wafer to be patterned by the lithography system of FIG. 1 constructed according to aspects of the present disclosure in one or more embodiments.

The method 200 includes an operation 204 by analyzing the collected radiation signal, particularly extracting characteristic data of the radiation signals 138 that is relevant to the pattern information of the patterned layer 120 and converting the radiation signal into layout information, such as the first IC layout described in FIG. 2.

The method 200 also includes an operation 208 by calculating overlay error (position error). The calculating the overlay error includes comparing the extracted layout information of the first IC layout with the desired first IC layout in the database (illustrated in block 206) to determine the overlay error at the location of the scanning spot of the incident beam 104 during the lithography exposure process.

The method 200 includes an operation 210 by feeding the overlay error (position information) to the lithography system 100 to adjust the lithography exposure process such that the overlay error is corrected (compensated). In one embodiment, the position information is provided to the stage control module 126 that controls the motion of the wafer stage 114 during the lithography exposure process according to the identified overlay error such that the overlay error is corrected.

Figure 11:
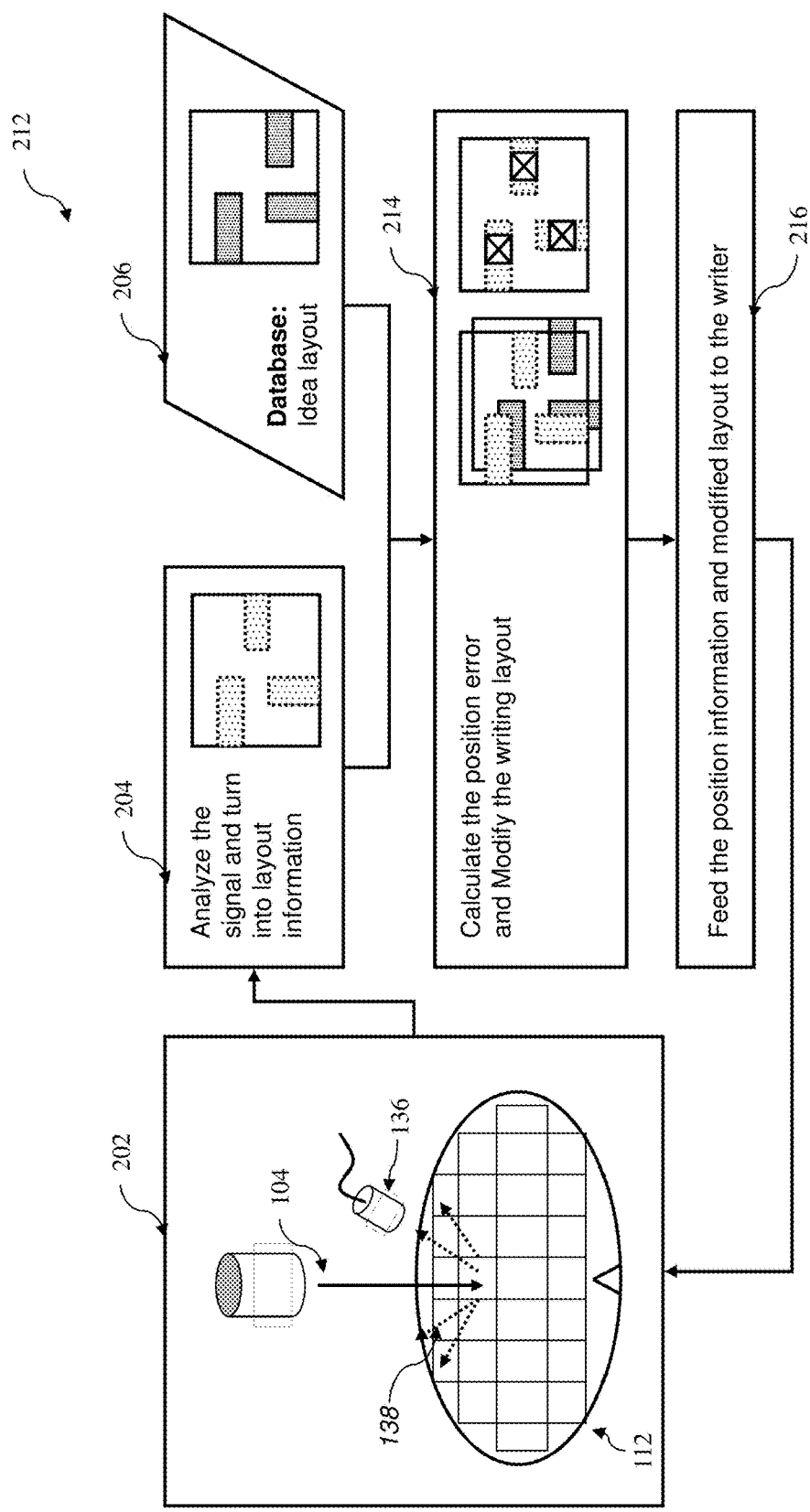
FIG. 11 is a block diagram illustrating various embodiments of the method of FIG. 4 constructed according to aspects of the present disclosure.

FIG. 11 is a block diagram of a method 212 for a lithography exposure process with overlay monitoring and overlay correction according to another embodiment. The method 212 may be another example of the method 150 and be implemented in the system 100. The method 212 is described with reference to FIG. 11 and with further reference to FIGS. 1-4.

The method 212 begins with an operation 202 by collecting radiation signal 138 from the wafer 112 during a lithography exposure process. The method 212 includes an operation 204 by analyzing the collected radiation signal, particularly extracting characteristic data of the radiation signals 138 that is relevant to the pattern information of the patterned layer 120 and converting the radiation signal into layout information.

The method 212 also includes an operation 214 by calculating overlay error (position error). The calculating the overlay error includes comparing the extracted layout information of the first IC layout with the desired first IC layout in the database (illustrated in block 206) to determine the overlay error at the location of the scanning spot of the incident beam 104 during the lithography exposure process. The operation 214 further includes modifying the second IC layout to be formed on the resist layer 124. For example, the first layout includes metal lines and the second layout includes via features. The second layout is modified according to the calculated overlay error such that the first pattern is formed on the resist layer 124 with overlay error corrected. This is advantageous in the e-beam lithography exposure process since the IC layouts are saved in files and can be changed in real time. In a lithography exposure process using a photomask, the IC layout is defined in the photomask and cannot be changed in real time.

The method 212 includes an operation 216 by feeding (the overlay error and) the modified layout to the lithography system 100 such that the lithography exposure process continues according to the modified layout, thereby the overlay error is corrected.

In another embodiment, the position information is provided to the stage control module 126 that adjusts the motion of the wafer stage 114 during the lithography exposure process; and the modified layout is provided to the e-beam exposure control module 144. The overlay error is corrected collectively by the modified layout and the adjusted motion of the wafer stage 114.

Figure 12:
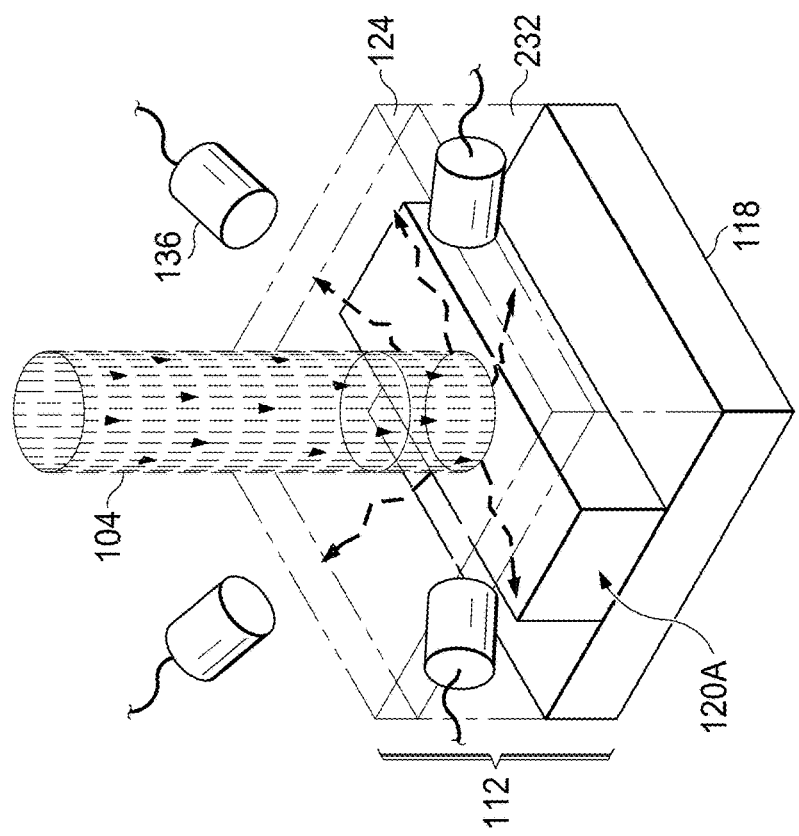
FIG. 12 is a perspective diagram illustrating one embodiment of the method of FIG. 4 constructed according to aspects of the present disclosure.

FIG. 12 is a perspective diagram illustrating a lithography exposure process as one embodiment of the method 150. The incident radiation beam 104 is directed to a feature 120A in the patterned layer. In the present example, the feature 120A is a metal line. The wafer 112 includes a substrate 118, an interlayer dielectric ("ILD") material layer 232 disposed on the metal line 120A and a resist ("PR") layer 124 on the ILD material layer 232. The incident radiation beam 104 is used in the lithography exposure process to pattern the ILD material layer 232, thereby forming a via trench (where a via feature is to be formed therein in subsequent process). The via feature is expected to be aligned with the metal line 120A for proper electrical routing. Accordingly, the incident radiation beam 104 is expected to land on the metal line 120A. By the method 150, the overlay error is determined between the incident radiation beam 104 and the feature 120A; and the operation 162 corrects the overlay error and ensures that the incident radiation beam is properly landing on the feature 120A during the lithography exposure process.

Figure 13:
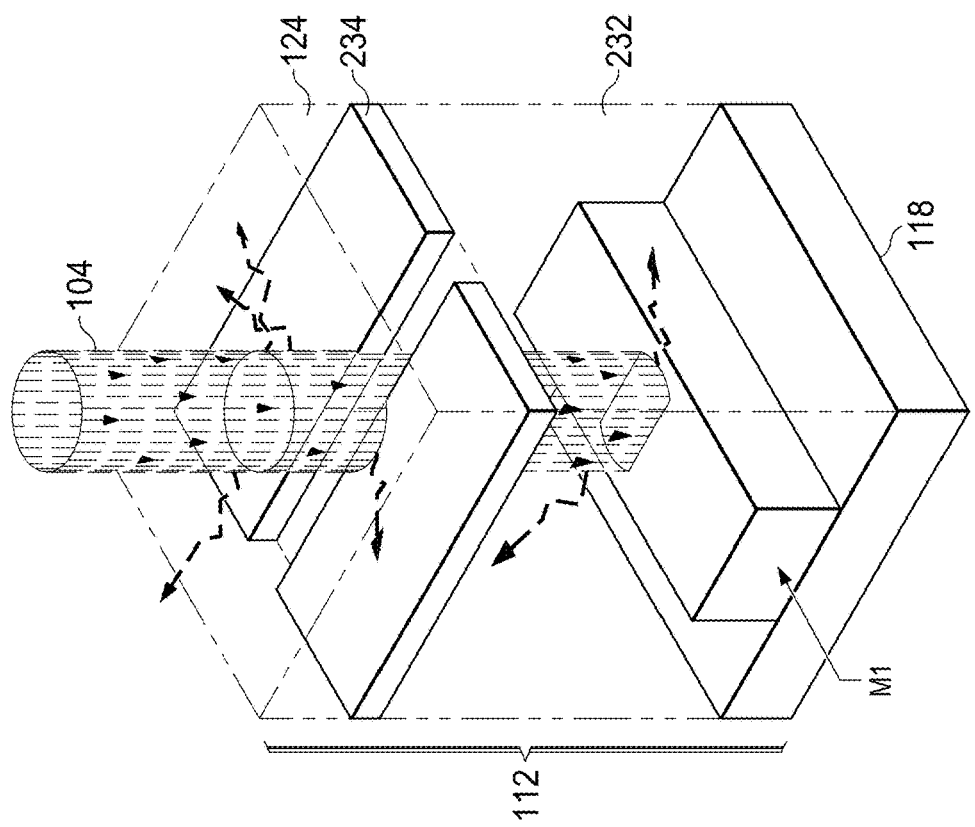
FIG. 13 is a perspective diagram illustrating another embodiment of the method of FIG. 4 constructed according to aspects of the present disclosure.

FIG. 13 is a perspective diagram illustrating a lithography exposure process as another embodiment of the method 150. The incident radiation beam 104 is directed to the wafer 112. In the present example, a dual damascene technique is used to form via features and metal lines. The wafer 112 includes a substrate 118, a first metal layer having a first metal line "M1". The wafer 112 further includes an interlayer dielectric ("ILD") material layer 232 disposed on the metal line "M1", and a hard mask layer 234 with an opening that defines a second metal line ("M2") intersecting with the first metal line "M1" in a top view. A resist layer 124 is disposed on the ILD material layer 232 and the hard mask layer 234. The incident radiation beam 104 is used in the lithography exposure process to pattern the ILD material layer 232, thereby forming a via trench (where a via feature is to be formed therein in subsequent process). The via feature is expected to be aligned with both the metal lines M1 and M2 for proper electrical routing. Accordingly, the incident radiation beam 104 is expected to land to the intersection position between the two metal lines in the respective metal layers. By the method 150, the overlay error is determined between the incident radiation beam 104 and the feature 120A, the operation 162 corrects the overlay error and ensures that the incident radiation beam is properly landing on the feature 120A during the lithography exposure process.

Figure 14:
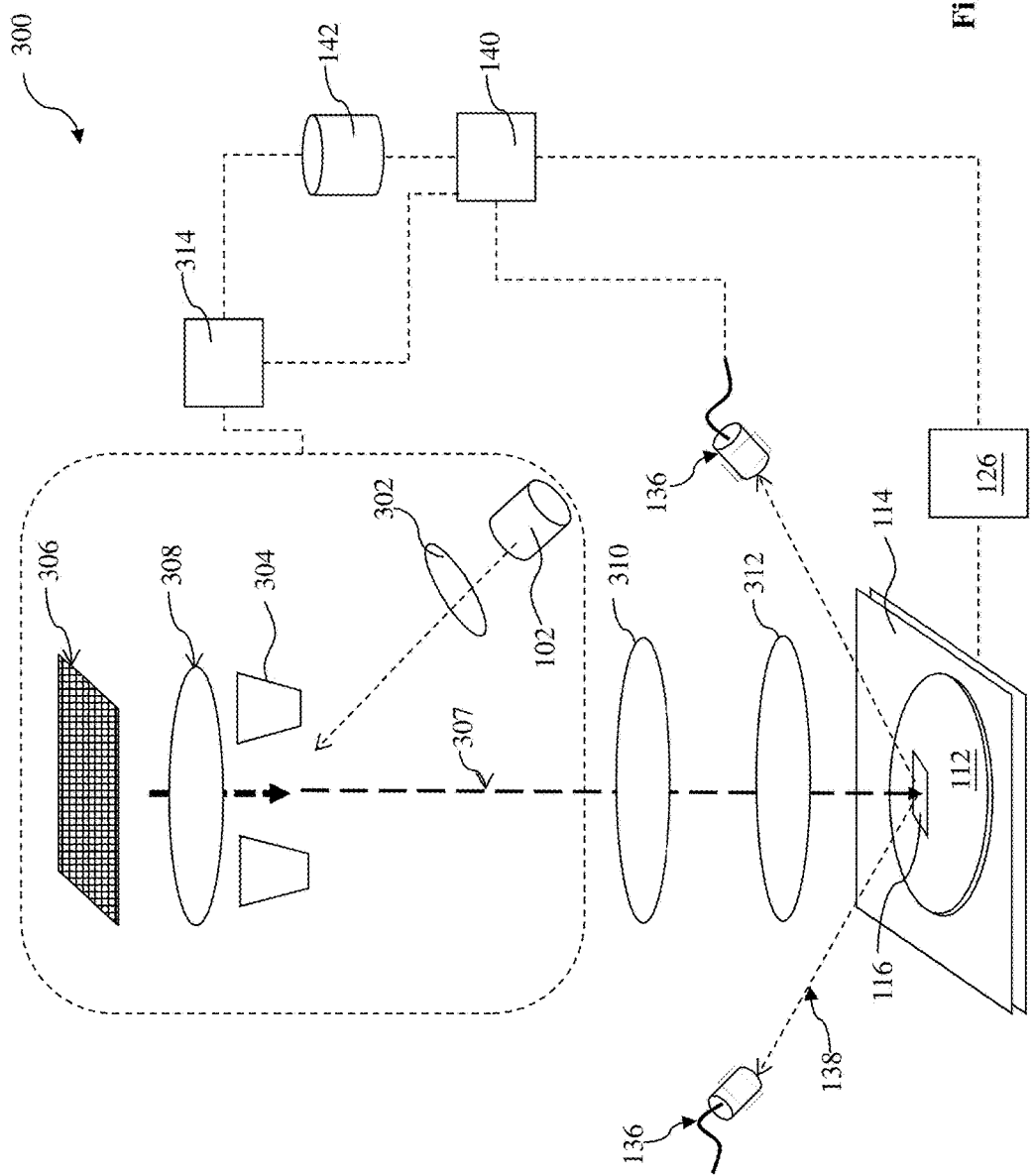
FIG. 14 is a schematic view of a lithography system with overlay monitor constructed according to aspects of the present disclosure in other embodiments.

FIG. 14 illustrates a schematic view of a lithography system 300 constructed according to aspects of the present disclosure in one or more other embodiment. The method 100, the method 200 or the method 212 may be implemented in the lithography system 300. The lithography system 300 is an electron-based lithography technique that utilizes an electron-based imaging for various IC patterning. The electron-beam lithography system 300 transfers an IC design pattern to an e-beam sensitive resist (e-beam-resist or resist) layer coated on a wafer, such as a semiconductor wafer. The electron-beam lithography system 300 provides a higher imaging resolution than that of an optical lithography because an electron beam can be energized to have a shorter wavelength. In the present embodiment, the lithography system 300 is a reflective e-beam lithography system that transfers an IC pattern to an e-beam resist layer.

The electron-beam lithography system 300 includes an electron source 102 to provide an electron beam. In furtherance of the embodiment, the electron source 102 is an electron gun with a mechanism to generate electrons, such as by thermal electron emission. In a particular example, the electron gun includes a tungsten (or other suitable material) filament designed and biased to thermally emit electrons.

The lithography system 300 may further include e-beam lens (gun lens) 302 configured in the front of the e-beam source 102 to control the e-beam, such controlling the e-beam to have a proper direction and/or a beam size. In one embodiment, the gun lens 302 may tune the e-beam from the e-beam source 102 to have a large spot with a uniform space distribution. In another embodiment, the e-beam from the e-beam source 102 may be further processed to have a proper beam spot and uniformity by other electron lenses.

The lithography system 300 may include a Wien filter 304 as an e-beam filter. The Wien filter 304 includes a module to generate perpendicular electric and magnetic fields that are used as a velocity filter for the e-beam.

The lithography system 300 includes a digital pattern generator (DPG) 306 to generate a patterned e-beam array. The DPG 306 is a structure that includes a plurality of pixels configured in an array. The pixels are dynamically and individually controllable to on-state and off-state. For example, a first subset of the pixels is controlled to on-state and a second subset of the pixels is controlled to off-state. When a pixel is on, the pixel reflects the e-beam projected on that pixel. When a pixel is off, the pixel does not reflect the e-beam projected on that pixel.

The DPG 306 reflects an e-beam projected thereon to form an e-beam pattern 307. The reflected e-beam pattern 307 is further projected on a wafer (substrate) 112 positioned on a wafer stage 114. The DPG 306 includes a mechanism to enable individual pixel to toggle between on and off states. The reflected e-beam pattern 307 varies dynamically according to the IC layout to be formed on the wafer 112 during the lithography exposure process. For example, the reflected e-beam pattern 307 dynamically varies and scans over a field 116 of the wafer 112 by the motion of the wafer stage (wafer stage) 114. The wafer 112 is coated with a resist layer 124 sensitive to e-beam.

The lithography system 300 includes one or more lenses to impact the e-beam for imaging effect. In one embodiment, the lithography system 300 includes a DPG lens 308, an upper demagnification (demag) lens 310 and a lower demag lens 312 as illustrated in FIG. 14.

The lithography system 300 also includes other components. In the present embodiment, the lithography system 300 includes a stage control module 126 coupled with the wafer stage 114 and designed to control the wafer stage 114 for various motions, such as translational motions and rotational motions in a plane perpendicular to the optical axis of the imaging lens module 106. In one example, the stage control module 126 includes a step motor to move the wafer stage 114 in precise control. The stage control module 126 includes a mechanism, such as an optical structure, to monitor the position of the wafer stage 114.

The lithography system 300 includes one (or more than one) sensor 136 configured to receive and detect a radiation signal 138 from the wafer 112. The radiation signal 138 is reflected from the wafer 112. The radiation signal 138 includes a portion that is reflected from the patterned layer 120 of the wafer 112 within the area where the e-beam 307 is projected on during the lithography exposure process. Therefore the radiation signal 138 carries the pattern information of the patterned layer 122. The sensor 136 is configured properly to receive the reflected fraction accordingly.

In one embodiment, the system 300 includes a plurality of sensors 136 configured at different locations enabling to extract the pattern information of the patterned layer 120 from the collective radiation signal 138 collected from various sensors 136. In one example, two sensors 136 are configured on opposite sides of the wafer stage 114, as illustrated in FIG. 1. In another example, four sensors 136 are symmetrically configured around the wafer stages. In furtherance of the example, the four sensors 136 are configured on four corners of a virtual square that is concentric with the wafer stage 114 or with the wafer 112 secured on the wafer stage. The radiation signal 138 thus collected carries the information of the IC pattern in the patterned layer 120 and is used to determine the overlay error.

The lithography system 300 also includes a pattern extraction module 140 to extract the information of the patterned layer 120 during the lithography exposure process. The pattern extraction module 140 is coupled with the sensor(s) 136 for receiving the data of the radiation signal from the sensor(s) 136. The pattern extraction module 140 includes hardware and software integrated to perform data analysis to the data of the radiation signal for pattern extraction. The pattern extraction module 140 is coupled with a database 142 to save the various data including the data of the radiation signal 138 and/or the data of the extracted pattern.

The lithography system 300 includes one or more mechanism to compensate the overlay shift based on the identified overlay shift, either in real time or in a feedback loop to compensate the overlay shift for the subsequent wafers to be patterned by the lithography system 100.

In one embodiment, the lithography system 300 includes an e-beam exposure control module 314 coupled with various components to control the DPG 306 (individual pixel on and off dynamically) according to the IC pattern. The e-beam exposure control module 314 may be coupled with the DPG 306 or integrated in the DPG 306. The pattern extraction module 140 is coupled with the e-beam exposure control module 144 to modify the IC pattern according to the overlay shift such that the overlay shift is compensated (corrected). Alternatively, the IC pattern in the database 142 is directly modified according to the overlay shift. The e-beam exposure control module 144 continues its exposure process based on the modified IC pattern.

In another embodiment, the pattern extraction module 140 is coupled with the stage control module 126 to tune the motion of the wafer stage 114 during the lithography exposure process according to the overlay shift such that the overlay shift is compensated.

Although various embodiments of the lithography system (such as 100 and 300) and the method (such as 150, 200 and 212) utilizing the same are provided according to various aspects of the present disclosure, various alternatives and modifications may be used without departure of the spirit of the present disclosure.

In one embodiment, the material layer 122 to be patterned by the lithography process and the patterned layer 120 are the same material layer. For example where UV light is used as the radiation beam and the double (or multiple) patterning technique is used to pattern a material layer by two subsequent lithography procedures to form respective patterns in the same material layers. The two patterns are to be aligned with each other from location to location.

In another embodiment, the substrate 112 may alternatively include other material, such as a glass substrate for liquid crystal display or a photomask used in wafer fabrication. For example, the photomask is a phase shift mask with two or more layers patterned and aligned to achieve resolution enhancement.

Thus, the present disclosure provides a lithography system. The lithography system includes a radiation source to provide radiation energy for lithography exposure; a substrate stage configured to secure a substrate; an imaging lens module configured to direct the radiation energy onto the substrate; at least one sensor configured to detect a radiation signal directed from the substrate; and a pattern extraction module coupled with the at least one sensor and designed to extract a pattern of the substrate based on the radiation signal.

The present disclosure also provides another embodiment of a lithography system. The lithography system includes an electron source operable to provide an electron beam for an electron beam lithography exposure process; a substrate stage configured to secure a substrate coated with a resist layer that is sensitive to the electron beam; an electron beam imaging module configured to direct the electron beam onto the resist layer of the substrate; a plurality of sensors configured to detect a radiation signal directed from the substrate during the electron beam lithography exposure process; and a pattern extraction module coupled with the plurality of sensors and designed to extract a first pattern of the substrate based on the radiation signal.

The present disclosure also provides one embodiment of a method for lithography patterning. The method includes performing a lithography exposure process to a resist layer coated on a substrate by a radiation beam; detecting a radiation signal from the substrate during the lithography exposure process; extracting a first pattern defined on the substrate from the radiation signal; and determining overlay shift according comparison between the first pattern and a second pattern to be formed on the resist layer by the lithography exposure process.

The present disclosure has been described relative to a preferred embodiment. Improvements or modifications that become apparent to persons of ordinary skill in the art only after reading this disclosure are deemed within the spirit and scope of the application. It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A lithography system, comprising:
a radiation source to provide radiation energy for lithography exposure;
a substrate stage configured to secure a substrate having a patterned layer and a material layer above the patterned layer, the material layer having a continuous flat top surface;
an imaging lens module configured to direct the radiation energy onto the substrate;
at least one sensor configured to detect a radiation signal during a lithography exposure process, wherein the radiation signal is emitted from the radiation source and is reflected from the patterned layer through the material layer and is of a same radiation type as the radiation energy; and
a pattern extraction module coupled with the at least one sensor and designed to extract a pattern of the patterned layer based on the radiation signal.

2. The lithography system of claim 1, wherein the at least one sensor includes two sensors configured on opposite sides of the substrate stage.

3. The lithography system of claim 1, wherein the at least one sensor includes four sensors configured on four corners of a square that is concentric with the substrate secured on the substrate stage.

4. The lithography system of claim 1, further comprising a stage control module coupled with the substrate stage, wherein the stage control module is operable to control the substrate stage to move relative to the radiation source.

5. The lithography system of claim 4, wherein the pattern of the patterned layer corresponds to a desired IC layout in a database, wherein the pattern extraction module is designed to further extract an overlay shift based on a comparison between the extracted pattern of the patterned layer and the desired IC layout.

6. The lithography system of claim 5, wherein
the pattern extraction module is further coupled with the stage control module and feeds the overlay shift to the stage control module; and
the stage control module is operable to control the substrate stage to compensate the overlay shift.

7. The lithography system of claim 1, wherein the radiation source includes an electron source to generate an electron beam for electron beam lithography exposure.

8. The lithography system of claim 7, further comprising an electron beam exposure control module designed to control electron beam writing, wherein
the pattern extraction module is coupled with the electron beam exposure control module and feeds the pattern extracted thereby to the electron beam exposure control module;
the electron beam exposure control module is operable to modify an IC layout to compensate an overlay shift extracted from a comparison between the pattern and the IC layout; and
the IC layout is to be formed on the substrate by the electron beam in an electron beam lithography exposure process.

9. The lithography system of claim 1, wherein the substrate includes
a resist layer that is sensitive to the radiation energy and is disposed on the material layer, wherein the radiation signal is redirected from the patterned layer through both the material layer and the resist layer during a lithography exposure process.

10. A lithography system, comprising:
an electron source operable to provide an electron beam for an electron beam lithography exposure process;
a substrate stage configured to secure a substrate, the substrate having a patterned layer and a resist layer over the patterned layer, wherein the resist layer is undeveloped and sensitive to the electron beam;
an electron beam imaging module configured to direct the electron beam onto the resist layer of the substrate to expose the resist layer;
a plurality of sensors configured to detect a radiation signal during the electron beam lithography exposure process, wherein the radiation signal is a portion of the electron beam directed from the patterned layer through the resist layer that is undeveloped; and
a pattern extraction module coupled with the plurality of sensors and designed to extract a first pattern of the patterned layer based on the radiation signal.

11. The lithography system of claim 10, wherein the plurality of sensors includes two sensors configured on opposite sides of the substrate stage.

12. The lithography system of claim 10, further comprising a stage control module coupled with the substrate stage, wherein the stage control module is operable to control the substrate stage to move relative to the electron source.

13. The lithography system of claim 12, wherein
the pattern extraction module is designed to further extract an overlay shift based on a comparison between the first pattern and a desired IC layout of the first pattern;
the pattern extraction module is further coupled with the stage control module and feeds the overlay shift to the stage control module; and
the stage control module is operable to control the substrate stage to compensate the overlay shift.

14. The lithography system of claim 10, further comprising an electron beam controller designed to control electron beam writing, wherein
the pattern extraction module is coupled with the electron beam controller and feeds the first pattern extracted thereby to the electron beam controller;
the electron beam controller is operable to modify a second pattern to compensate an overlay shift derived from a comparison between an extracted position of the first pattern on the substrate and a desired position of the first pattern in an IC layout database; and
the second pattern is to be formed on the substrate over the first pattern by the electron beam lithography exposure process using the electron beam.

15. The lithography system of claim 10, wherein the first pattern extracted from the radiation signal by the pattern extraction module includes an integrated circuit (IC) feature.

16. A method for lithography patterning, comprising:
performing a lithography exposure process to a resist layer coated on a substrate by a radiation beam;
detecting a radiation signal that is a portion of the radiation beam reflected from a patterned layer of the substrate underneath the resist layer during the lithography exposure process, wherein the resist layer is not developed and has a continuous flat top surface;
extracting a first pattern from the radiation signal; and
determining an overlay shift between the first pattern and a second pattern to be formed on the resist layer by the lithography exposure process according to a comparison between a position of the first pattern on the substrate and a desired position of the first pattern in an IC layout.

17. The method of claim 16, further comprising varying the lithography exposure process to compensate the overlay shift.

18. The method of claim 17, wherein the varying the lithography exposure process includes one of
controlling motion of a substrate stage to compensate the overlay shift during the lithography exposure process of forming the second pattern over the first pattern; and
modifying the second pattern according to the overlay shift.

19. The method of claim 17, wherein the detecting of the radiation signal, the extracting of the first pattern, the determining of the overlay shift, and the varying of the lithography exposure process occur during the same lithography exposure process to the resist layer.

20. The method of claim 16, further comprising
feeding back the overlay shift to a next lithography exposure process; and
performing the next lithography exposure process to a next substrate.

21. The method of claim 16, wherein the performing of the lithography exposure process includes performing an electron-beam exposure process to the resist layer by an electron beam; and the detecting of the radiation signal from the substrate includes detecting an electron signal that is a portion of the electron beam and is redirected by the patterned layer of the substrate through the resist layer simultaneously with the lithography exposure process.

* * * * *